United States Patent [19]

Eriksson et al.

[11] Patent Number: 5,771,147
[45] Date of Patent: Jun. 23, 1998

[54] DEFECTIVE EARTH TESTING FOR AN ELECTRIC FENCE ENERGIZER

[75] Inventors: Lars-Arne Eriksson, Sundsvall; Göran Karl-Olov Karlsson, Enhörna, both of Sweden

[73] Assignee: Alfa Laval Agri AB, Tumba, Sweden

[21] Appl. No.: 663,108

[22] PCT Filed: Dec. 29, 1994

[86] PCT No.: PCT/SE94/01268

§ 371 Date: Aug. 22, 1996

§ 102(e) Date: Aug. 22, 1996

[87] PCT Pub. No.: WO95/18519

PCT Pub. Date: Jul. 6, 1995

[30] Foreign Application Priority Data

Dec. 29, 1993 [SE] Sweden .................................. 9304342

[51] Int. Cl.$^6$ ........................................................ H05C 1/04
[52] U.S. Cl. ........................... 361/232; 256/10; 324/510; 340/649
[58] Field of Search ..................................... 361/230, 231, 361/232, 235; 324/510; 340/649; 256/10

[56] References Cited

U.S. PATENT DOCUMENTS

| | | |
|---|---|---|
| 3,051,449 | 8/1962 | Legrand . |
| 3,205,378 | 9/1965 | Kline . |
| 3,332,001 | 7/1967 | Schwarz . |
| 3,378,694 | 4/1968 | Griffeth . |
| 3,397,344 | 8/1968 | Skirpan . |
| 3,448,361 | 6/1969 | Dinter . |
| 3,525,878 | 8/1970 | Houlne . |
| 3,566,149 | 2/1971 | Paradissis . |
| 3,581,299 | 5/1971 | Schmit ..................................... 256/10 |
| 3,590,279 | 6/1971 | Thompson . |
| 3,654,489 | 4/1972 | Knapton . |
| 3,655,994 | 4/1972 | Maime . |
| 3,655,995 | 4/1972 | Maime . |

(List continued on next page.)

FOREIGN PATENT DOCUMENTS

| | | |
|---|---|---|
| 0036089 | 2/1981 | European Pat. Off. . |
| 0248133 | 12/1987 | European Pat. Off. . |
| 0179435 | of 0000 | Germany . |
| 2847993 | 5/1980 | Germany . |
| 216748 | 4/1986 | New Zealand . |
| 219542 | 3/1987 | New Zealand . |

OTHER PUBLICATIONS

Semko Certificate issued Apr. 15, 1987.

*Primary Examiner*—Fritz Fleming
*Attorney, Agent, or Firm*—Hovey,Williams,Timmons & Collins

[57] ABSTRACT

In an electric fence energizer there is an exterior earth connection such as an earth connection post (16). The electric fence energizer comprises in the conventional way a transformer (T) having a primary winding ($L_1$) and a secondary winding ($L_2$), one exterior terminal (9) of which is connected to the conductor (17) in the electric fence and the other exterior terminal (11) is connected to the earth connection, high voltage pulses being induced over the secondary winding ($L_2$) when voltage pulses are applied over the primary winding ($L_1$). For a determination of the quality of the earth connection, the voltage over a small part of the secondary winding ($L_2$) is obtained capacitively by means of an extra winding ($L_3$) in the transformer (T). For an evaluation of this voltage, it is connected, only for a determined polarity, to a charging circuit for a capacitor ($C_2$), which is discharged over a known resistor ($R_2$, $R_3$). The voltage ($V_{21}$) over this capacitor ($C_2$) is processed for a determination of the quality of the connection to earth. Then the time difference can be determined between the time ($t_0$) when the induction high voltage pulse over the secondary winding ($L_2$) starts, and the times ($t_1$, $t_2$) when a voltage change of the capacitively obtained signal after that starts and when the voltage returns to its stationary value. These time differences are compared to threshold values for determination of the quality of the connection to earth. The capacitively obtained voltage can also be used for other determinations in the electric fence energizer.

38 Claims, 4 Drawing Sheets

U.S. PATENT DOCUMENTS

| | | |
|---|---|---|
| 3,743,924 | 7/1973 | Genuit et al. . |
| 3,772,601 | 11/1973 | Smith . |
| 3,883,804 | 5/1975 | Wilson .................................. 324/122 |
| 3,928,809 | 12/1975 | Tschudi et al. . |
| 4,087,705 | 5/1978 | Barnes . |
| 4,090,140 | 5/1978 | Carter . |
| 4,099,128 | 7/1978 | Hooper . |
| 4,150,307 | 4/1979 | Loucks . |
| 4,158,785 | 6/1979 | Desaintfuscien . |
| 4,160,214 | 7/1979 | Colin et al. . |
| 4,274,033 | 6/1981 | Nuckolls . |
| 4,310,869 | 1/1982 | Niven ...................................... 361/232 |
| 4,322,817 | 3/1982 | Kuster . |
| 4,329,595 | 5/1982 | Watson . |
| 4,394,583 | 7/1983 | Standing . |
| 4,396,879 | 8/1983 | Weinreich et al. . |
| 4,456,835 | 6/1984 | Pichler et al. . |
| 4,771,245 | 9/1988 | Woodhead .............................. 340/649 |
| 4,859,868 | 8/1989 | McKissack . |
| 5,550,530 | 8/1996 | Hamm ...................................... 256/10 |

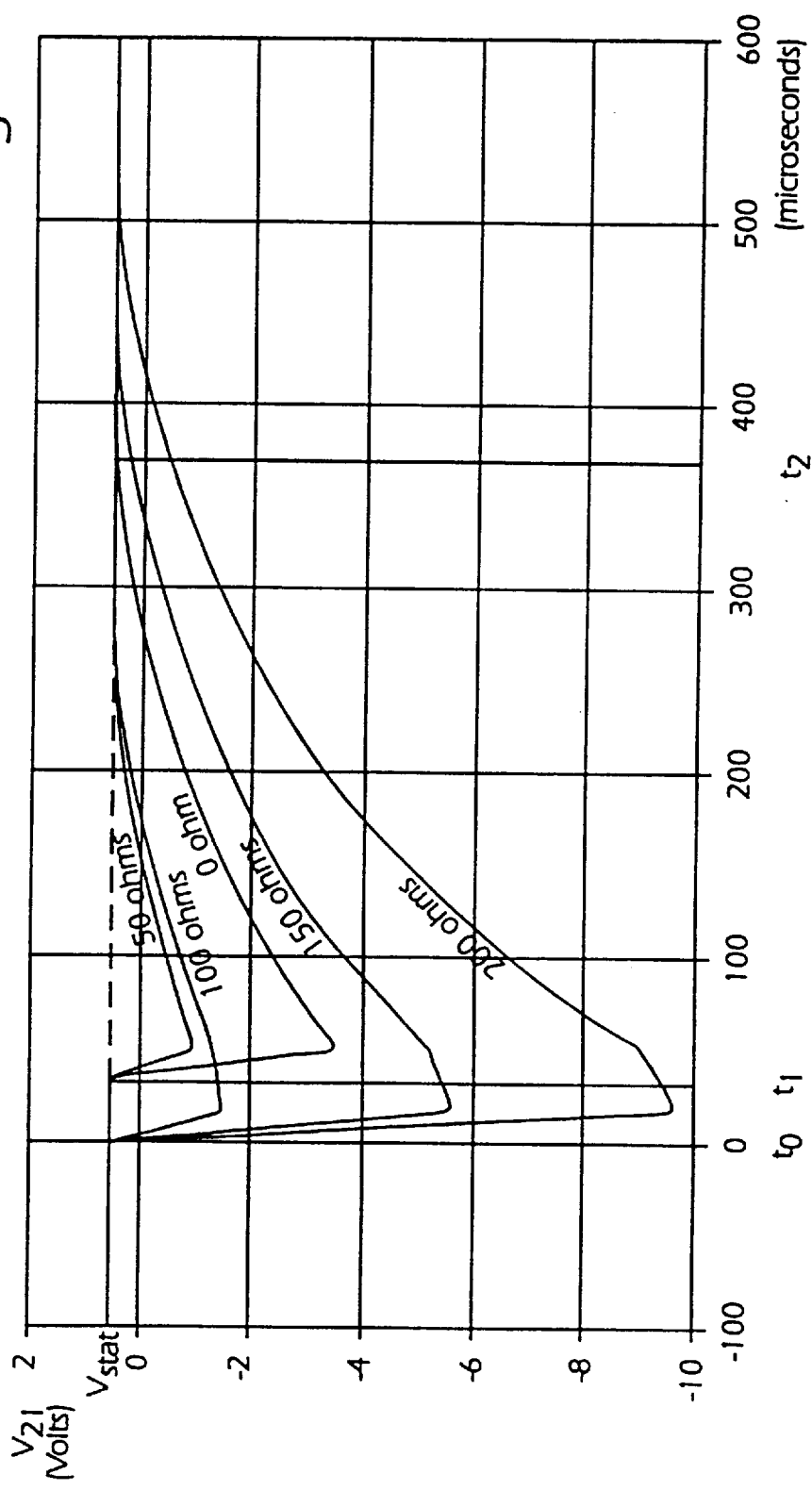

DEFECTIVE EARTH TESTING FOR AN ELECTRIC FENCE ENERGIZER

BACKGROUND OF THE INVENTION

1. Field of the Invention

The present invention relates to a device for testing the earth connection and measurement of the quality thereof for an electric fence energizer of the capacitor discharge type, in particular for determining whether the earth connection of the fence is defective. The energizer is principally a high voltage pulse generator and comprises in the conventional way a capacitor which is charged to a high voltage and is discharged to the primary winding of a transformer, the secondary winding of the transformer providing a very high voltage to an electric fence circuit.

2. Description of the Prior art

Electric fences conventionally comprise a bare electric conductor, one end of which, the proximate end, is connected to one output terminal of the electric fence energizer which provides, on its output terminals, high voltage pulses to the current conducting portion of the electric fence. The other output terminal of the energizer is connected to earth or grounded. The earth connection is conventionally made by the method that a pointed electrically conductive part, such as a metal part, an earth connection post, is inserted in the ground or soil close to the electric fence energizer as deeply as possible, preferably so deeply that a contact is obtained with humid layers in the ground. However, it is difficult to directly determine the quality of an earth connection and it will, in addition, vary depending on the weather and particularly on possible snow or rain. When the fence is heavily loaded, i.e. when the electrical resistance between the output terminals is low, a bad earth connection causes that the pulse from the electric fence energizer is applied over the earth connection instead of being applied over the fence, that is most of the output voltage is applied over the conducting path from the earth connection post to the ground surface area, where for instance an animal is standing, and a small part over the path from this ground surface area through the animal to the fence conductor, when the animal is in electrical contact with the fence conductor. The result thereof is a less performing or cancelled preventive or deterring effect of the electric fence.

A method for measuring the quality of the connection to earth is inserting a second earth connection post into the ground or soil at a place so far away from the first normal earth connection post that they do not influence each other. No significant current will then flow in the second earth connection post, and thus it is sufficient to use a second earth connection post having a simpler construction. During an electric fence pulse the voltage is measured from the normal earth connection of the electric fence device to this second earth connection post and if the voltage is too high, the earth connection is considered to be bad. This measurement is normally made by connecting a glow-discharge tube, which is arranged to be illuminated at the desired voltage difference between the earth connection posts. The disadvantages of this method are several: An extra earth connection post is required, this extra earth connection post must be connected correctly to earth and the signal does not consider the load from the fence, to which the energizer is subjected.

There is thus a need for methods and devices for determining the quality of the earth connection of an electric fence energizer, which do not require any extra steps performed by an operator, for instance without an extra earth connection post or without depressing some special key, but which can provide information directly on the quality of the earth connection in the electric fence energizer itself as fast as it is connected to its power supply and to the fence conductor and is started.

Various requirements from authorities restrict different characteristics of the electric voltage pulses which are allowed to be supplied to an electric fence. Such requirements can typically comprise that the pulses must not come more frequently than one pulse per second and that the length of each pulse must be less than 1.5 ms. It means that a relatively long time exists between each pulse and that during these intermediate time periods an electric fence energizer will normally enter a stationary electric state so that currents and voltages inside the pulse generating circuits are constant. These requirements naturally exist in order to reduce the risk for damage to people and animals which will contact the fence conductor.

In the German published application No. 2 225 630 the quality of the fence isolation is determined by operating a switch T1, which closes an electric path from an output terminal of a secondary winding in a step-up transformer L2 to ground through a resistor R10 and a glow-charge tube I2. When the switch is closed, the glow-charge tube should be illuminated for a good fence isolation and thus a good connection to earth.

An electric fence energizer is disclosed in U.S. Pat. No. 3,378,694 for T. F. Griffith and comprises an energy storage capacitor 72 connected to a primary winding 30, 32 in a transformer 26, which has a secondary winding 28 connected to the electric conductor 16 in an electric fence and to an earth connection device 34 deeply inserted into the ground. By means of a sensing device 70, 74 the varying humidity of the earth can be sensed and the resistance of the resistor 68 be adjusted for compensation thereof.

Earth testing means for an electric fence is disclosed in the published European patent application No. 0 248 133. The output terminal of the energizer which is to connected to earth is, through isolation capacitors $C_1$ and $C_2$ and a calibration resistor $R_1$, also connected to one input of a differential voltage indicator DIVI, the other input thereof being connectable, through manual operation of a switch S1, to a secure mains earth, such as the earth or neutral line of the mains supply. The voltage indicator then displays the potential difference between the fence earth and the secure mains earth. The input of the voltage indicator may be preceded by a peak voltage monitoring means holding the worst case test voltage to be displayed by the voltage indicator. In this document also a simple manual method of testing a fence earth connection is described, see col. 2, lines 16–34.

SUMMARY OF THE INVENTION

It is an object of the invention to provide a method by means of which the quality of the earth connection of an electric fence energizer can be determined in a reliable and simple way without extra exterior measures.

It is a further object of the invention to provide an electric fence energizer in which a determination of the earth connection is performed automatically and directly when the device is started and then for instance an indication thereof is obtained by the device.

It is a further object of the invention to provide an electric fence energizer and a device within such an electric fence energizer by means of which a secondary voltage completely risklessly can be connected to control circuits in the electric fence energizer for evaluation of an induced high secondary voltage.

By means of the invention methods and electric fence energizers are provided and devices therein which in the respective cases satisfy the need mentioned above and achieve the aforementioned objects. This method and this electric fence energizer thus provide, without for instance extra parts inserted into the ground, a reliable determination of the quality of the earth connection. The detailed features of the invention appear from the appended claims.

The circuits for determining the quality of the earth connection are only connected on the primary side of the transformer and thus always sensing voltages or other characteristics on the primary side. No galvanic connections need to be made to the fence circuit on the secondary side.

In an electric fence energizer there is, as conventional, an exterior earth connection such as an earth connection post inserted into the ground. The exterior earth connection is coupled to an output terminal of the energizer. Further, the electric fence energizer comprises in the conventional way a step-up transformer having a primary winding and a secondary winding, the terminals of the secondary winding also being the output terminals of the energizer. One exterior terminal of the secondary winding is connected to the conductor in the electric fence and the second exterior terminal thereof is thus connected to the exterior earth connection. High voltage pulses are induced over the secondary winding of the transformer when voltage pulses are applied over the primary winding. For a determination of the quality of the earth connection a voltage is obtained which represents, and for instance can be essentially proportional to, the voltage between the second terminal of the secondary winding, which is connected to the exterior earth connection, and an artificial earth or ground potential.

This artificial earth potential is an electronics or signal ground potential which is used as a ground or earth connection by electronic control devices in the electric fence energizer and for an electric fence energizer, supplied with alternating current from for instance the public electric energy distribution network, is the potential on one of the mains supply conductors terminals such as the potential on the neutral line or a phase line thereof.

The voltage over a small portion of the secondary winding is obtained or recovered capacitively, i.e. by a capacitive coupling to this small winding portion, preferably by means of an extra winding in the transformer, this winding forming one plate in a capacitor and the other plate being formed by the small portion of the secondary winding.

The obtained voltage can be evaluated for a determination of the quality of the earth connection by a determination of various characteristic quantities, such as that its maximum swing or maximum deviation from a stationary value with a definite polarity is determined, that the time difference is determined, before the obtained voltage starts to deviate from its stationary value when a high voltage pulse is induced, and/or returns to its stationary value after induction of a high voltage pulse, etc.

In the obtained voltage the absolute voltage difference can thus be determined between a voltage value which exists quite or immediately before or a very small time before the time when a voltage pulse is applied to the primary winding for the induction of a high voltage pulse over the secondary winding, and a voltage peak value which has the largest absolute magnitude and which occurs after the voltage pulse has been applied over the primary winding. The value of the determined absolute difference may then be compared to a predetermined threshold value for deciding that an unsatisfactory connection to earth exists, in the case where the determined absolute difference exceeds the predetermined value.

For the evaluation, in an advantageous way, the obtained voltage can be coupled, substantially only for a predetermined polarity, to a charging circuit for a capacitor which is discharged over a known resistor. The voltage over this capacitor is evaluated for determination of the quality of the earth connection. Then the time difference can be determined between the time when the induction of a high voltage pulse over the secondary winding starts, and the time when a voltage change of the signal which is obtained capacitively starts thereafter. The maximum discharge voltage can also be determined. The time difference can also be determined between the time when the induction of a high voltage pulse over the secondary winding starts, and the time when the signal capacitively obtained after that returns to a stationary value which it had before the high voltage pulse, during the intermediate times between the high voltage pulses, when stationary electric conditions in the electric circuits at least partially exist. This measured time difference represents a measure of or provides indirectly the maximum charge voltage of the capacitor.

More specifically, the time difference is determined between the time, when the induction of a high voltage pulse starts over the secondary winding, and the time, when the value of the capacitively obtained voltage after that again obtains essentially its value before the start of induction of the high voltage pulse after having deviated, during the induction of the high voltage pulse, from this previous value. In particular the second time may be taken as the time when the obtained voltage again deviates from its previous value, which existed at the start of the voltage pulse, by a value, the absolute magnitude of which is lower than a predetermined, in particular small, voltage value. By a small voltage is here meant a voltage being a small fraction of the total amplitude of the voltage signal.

Then the determined time difference can be compared to a predetermined threshold value, a time threshold, and it can be decided that a good connection to earth exists, if the measured or determined time difference exceeds this predetermined threshold value.

In the obtained voltage the time difference can also be determined between the time when a voltage pulse starts to be applied to the primary winding for induction of a high voltage pulse and the time, when after that the obtained voltage starts to change or vary, in particulate deviates from its previous value at the start of the voltage pulse by a value, the absolute magnitude of which exceeds a predetermined, in particular small, voltage value. By a small voltage is as above meant a voltage being a small fraction of the total amplitude of the obtained voltage.

Then the determined time difference can also as above be compared to a predetermined threshold time value for deciding that a satisfactory connection to earth exists, in the case where the determined or measured time difference exceeds this predetermined threshold value.

Generally, the voltage pulses are assumed to be applied to the primary winding, so that sufficient time periods exist between those time periods, during which these pulses are applied to the primary winding and during which high voltage pulses are induced over the secondary winding, in order that, during these sufficiently long, intermediate time periods, the electric condition in the electric fence energizer and particularly in its control circuits and the transformer will take an essentially stationary state.

According to another aspect, in the evaluation process, the capacitively obtained voltage can be coupled to a charging circuit for a capacitor. This coupling is made or is effective only for such a voltage over the secondary winding which has an essentially predetermined polarity, in particular in relation to the voltage which is stationarily applied over the capacitor. The capacitor is then discharged over a resistor, and the voltage at a charging of and/or a discharging of this capacitor through the resistor is evaluated for a determination of the quality of the connection to earth.

In the coupling of the capacitively obtained voltage to the charging circuit for the capacitor this coupling can then be made in such a way that the voltage controls the charging of the capacitor, so that the capacitor is charged to essentially an extreme value or a peak value of the voltage. In the evaluation of the discharge voltage for the capacitor the charge and/or discharge voltage is in this case preferably sensed in the respective cases by a transistor amplifier. In the evaluation of the voltage, when charging the capacitor, the time can also be determined, when the voltage starts to change from a previous stationary value, in particular the time, when the voltage deviates from a previous stationary value by a value, the absolute magnitude of which exceeds a predetermined, particular small, value, the word small here and below being used as defined above. In the evaluation of the voltage and for discharging the capacitor the time is determined, when the voltage returns to a previous stationary value, in particular the time, when the voltage again deviates from a previous stationary value by a value, the absolute magnitude of which is smaller than a predetermined, in particular small, value.

Generally the device for determining the quality of a connection to earth thus comprises a generator for generation of voltage pulses over the primary winding of the transformer, whereby high voltage pulses are induced over the secondary winding. Further, there are means for obtaining a voltage representing the voltage between the second exterior terminal of the secondary winding, which is connected to the exterior earth connection, and a ground potential. Finally there is an evaluation circuit arranged for evaluation of the obtained voltage. The means for obtaining the voltage comprises a first capacitor plate in a first capacitor, the second plate of which is formed by a small portion of the secondary winding. The first capacitor plate in the first capacitor then advantageously comprises an extra winding in the transformer, this extra winding being located at or adjacent the secondary winding. The extra winding in the transformer can then comprise a layer of winding wire arranged at or close to one or several layers, for instance between two successive layers, of winding wire which are comprised in the secondary winding.

The evaluation circuit may be connected to the first capacitor plate for evaluation of the voltage over the first capacitor. The evaluation circuit comprises advantageously means for determining in the obtained voltage the absolute difference between the voltage value which exists quite before or a very small time before the time when a voltage pulse is applied over the primary winding for induction of a high voltage pulse, and the voltage value which has the largest absolute magnitude and is achieved after the voltage pulse has been applied over the primary winding. The evaluation circuit can then comprise comparator means for comparing the determined absolute difference to a predetermined threshold value and means for deciding that an unsatisfactory connection to earth exists, in the case where the determined absolute difference exceeds the predetermined value.

The evaluation circuit can in another aspect comprise means for determining the time difference between the time, when the induction of a high voltage pulse starts over the secondary winding, and the time when the value of the capacitively obtained voltage after that returns essentially to the value which it had before the start of induction of the high voltage after having deviated, during the induction process, from this previous value. The evaluation circuit can then as above comprise comparator means for comparing the determined time difference to a predetermined time threshold value and means for deciding that a good connection to earth exists if the determined time difference exceeds this predetermined value.

According to still another aspect, the evaluation circuit can comprise means for determining, in the obtained voltage, the time difference between the time, when a voltage pulse starts to be applied over the primary winding for induction of a high voltage pulse, and the time, when after that the obtained voltage starts to change or vary, in particular deviates from its previous value at the start of the voltage pulse by a value, which exceeds a predetermined, in particular small, voltage value. Then the evaluation circuit may as above comprises comparator means for comparing the determined time difference to a predetermined threshold value and means for deciding that a satisfactory connection to earth exists, in the case where the determined time difference exceeds this predetermined threshold value.

According to a further aspect, the evaluation circuit may comprise a second capacitor and a charging circuit for charging it. A rectifier such as suitable semiconductor diode is arranged for coupling the voltage on the first capacitor plate in the first capacitor to the charging circuit for the second capacitor. A resistor is connected to the second capacitor, through which it can be discharged and there is an evaluation device for determining the charge voltage and/or discharge voltage of the second capacitor. Then the second capacitor may have its first terminal or plate connected to the ground potential and its second terminal or plate connected to the rectifier. The evaluation device comprises advantageously a connection line for applying the voltage over the second capacitor to one terminal of a resistor, the other terminal of which is connected to a direct voltage. This direct voltage is a supply voltage and has a constant value as related to the signal or artificial ground. The voltage over the second capacitor can be discharged through the resistor. The resistor comprises preferably a voltage divider circuit, the central connection of which is connected to the base of a transistor.

The method of obtaining the voltage over a small part of the secondary winding capacitively and supply it to the control circuit can generally be used in an electric fence energizer to couple a portion of the voltage over the secondary winding to some control circuit in the electric fence energizer. Then, as above, the voltage can be obtained at an end or a terminal of an extra winding in the transformer arranged at or close to the secondary winding. In the capacitive obtainment process thus a first capacitor plate in a capacitor is used, the second plate of which is formed by a small portion of the secondary winding, and this first capacitor plate advantageously comprises an extra winding in the transformer and this winding is then arranged close to or at the secondary winding. The extra winding in the transformer comprises in a preferred embodiment one layer of winding wire arranged close to, for instance directly on top of or inside, a layer of winding wire which is a part of the secondary winding.

To make a capacitor in this way, for coupling a voltage representative of the secondary voltage, has manufacturing advantages since the high voltage transformer in an electric fence energizer is always designed for the used high voltages. It is simple to only add, in the manufacture of the transformer, a layer of an extra winding at a suitable place, with a suitable isolation, to obtain a capacitor resistant to high voltages, for which the risk of flash-over and thus a conduction of high voltages to control circuits in the electric fence energizer is eliminated or in any case very small.

In an electric fence energizer, which comprises a transformer having a primary winding and a secondary winding, where one exterior terminal of the secondary winding is connected to the conductor in the electric fence and the other exterior connection thereof is connected to an exterior earth connection device, and which further comprises a generator for generating voltage pulses over the primary winding, whereby high voltage pulses are induced over the secondary winding, a device may thus generally be arranged for coupling a voltage representative of the voltage over the secondary winding to a control circuit in the electric fence energizer. This device then comprises a first capacitor plate in a capacitor, the other plate of which is formed by a small part of the secondary winding. The first capacitor plate in the capacitor is preferably an extra winding in the transformer arranged at or adjacent the secondary winding. The extra winding in the transformer can then comprise one layer of winding wire arranged at or adjacent to one or preferably several layers of winding wire, for instance between two successive layers, which are included in the secondary winding.

BRIEF DESCRIPTION OF THE DRAWINGS

The invention will now be described with reference to the accompanying drawings which illustrate a non-limiting embodiment and in which:

FIG. 4 shows voltage curves for earth connections of varying quality.

DETAILED DESCRIPTION OF THE PREFERRED EMBODIMENT

Figure 1:
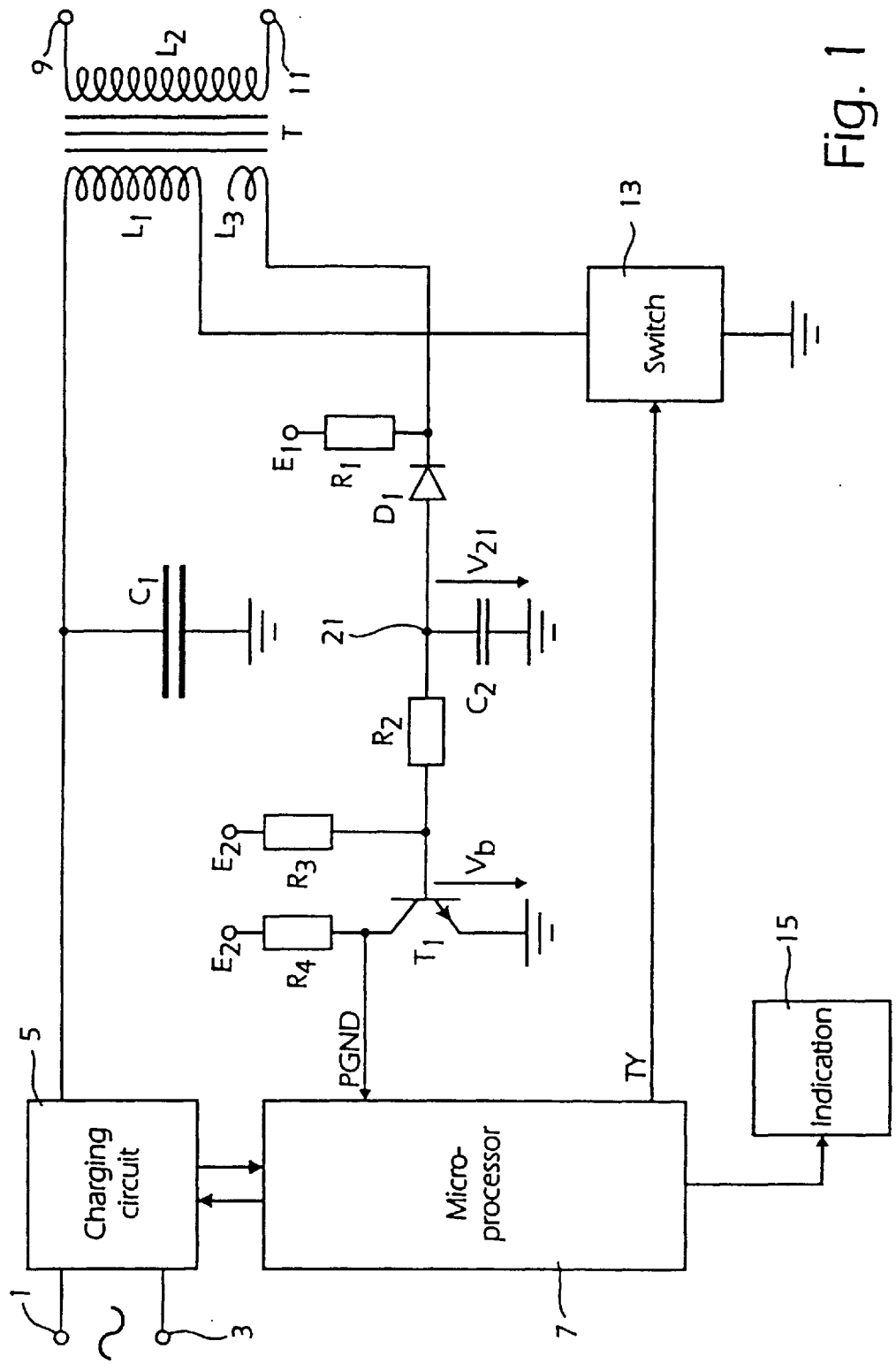
FIG. 1 shows a circuit diagram of an electric fence energizer having an incorporated measurement of defective earth.

An electric circuit for an electric fence energizer is illustrated, in its principal parts, by the circuit diagram of FIG. 1. The alternating voltage from an electric energy distribution network is supplied between mains terminals 1 and 3 to a charging circuit 5. A microprocessor 7 controls the charging circuit 5 for charging an energy storage capacitor $C_1$ which has a large capacitance and which is charged by the charging circuit 5 to a high voltage. The storage capacitor $C_1$ has its one terminal connected to signal ground and the other terminal is connected to a primary winding $L_1$ of a transformer T which is provided with a secondary winding $L_2$. The secondary winding $L_2$ feeds the fence circuit or fence conductor which is connected between the terminals 9 and 11 of the secondary winding, these terminals forming the output terminals of the energizer.

The other end of the primary winding $L_1$ is through a control switch 13 connected to signal ground, this switch being controlled by a signal TY from the microprocessor 7. The switch 13 can in the conventional way be constructed as a thyristor circuit, not shown, containing a thyristor, the positive terminal of which is connected to the primary winding $L_1$ and the negative terminal of which is connected to signal ground and the gate electrode of which, possibly through some amplifying circuit, is controlled by the signal TY.

The transformer T has, in addition, an extra short winding $L_3$, one end of which is free and the other end of which, through a resistor $R_1$, is connected to a first positive supply DC voltage $E_1$ of for instance 12 V, as seen in relation to the signal ground. This other end is further, through a diode $D_1$, connected to a first terminal of a capacitor $C_2$, the other terminal of which is connected to signal or electronics ground. The charge voltage of the capacitor $C_2$ is sensed by means of a transistor amplifier stage, by the method that its first plate or terminal is connected, through two resistors $R_2$, $R_3$ which are connected to each other in series, to a second positive supply voltage $E_2$ of for instance 5 V, as taken in relation to electronics ground. The middle point between the resistors $R_2$ and $R_3$ is connected to the base of a transistor $T_1$. The transistor $T_1$ has its collector connected to the second positive supply voltage $E_2$ through a resistor $R_4$ and a signal is obtained on the collector and is provided to an input terminal PGND of the microprocessor 7. The emitter of the transistor $T_1$ is connected to signal ground. The microprocessor 7 evaluates the voltage signal on the input terminal PGND and shows an observed faulty earth connection by means of an indicator or display device 15, for instance in the shape of or comprising a light emitting diode, to which, for a defective earth connection, a voltage is applied and which is then illuminated.

Figure 3:
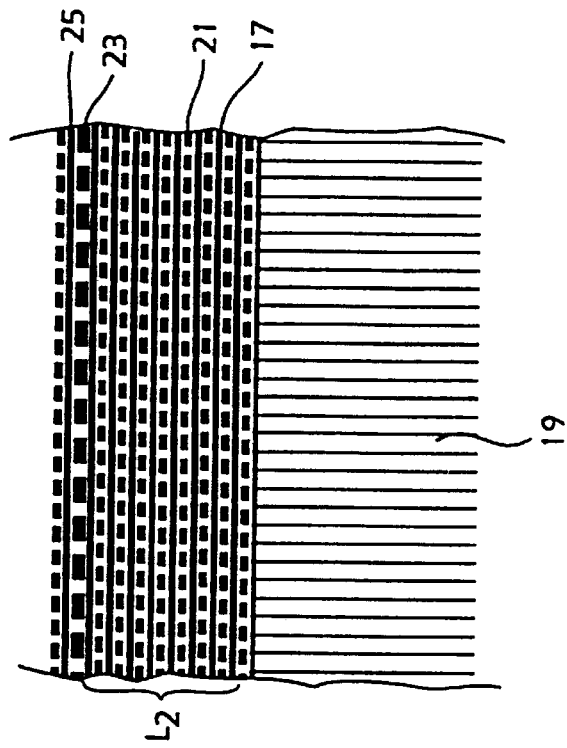
FIG. 3 shows a partial section of a high voltage winding in the energizer.

As is illustrated in FIG. 3, the high voltage winding $L_2$ comprises eight layers of thin copper wire 17 wound on a core 19 and isolated by plastic sheets 21 between the layers. On top of the outermost layer there is also an isolating plastic sheet 23 and on top thereof a further layer 25 forming the extra winding $L_3$ which has been wound in such a way that a known capacitance is obtained between the outermost layer of the high voltage winding $L_2$ and the extra winding $L_3$. The isolating plastic sheet 23 inside the extra winding 25 should be sufficiently thick in order to prevent flash-over or electrical break-through between this winding and the outermost layer in the high voltage winding $L_2$.

In an alternative embodiment the extra winding $L_3$ can be constructed in the shape of an electrically conductive sheet or metal plate instead of being wound by copper wire in the layer 25, as is illustrated in FIG. 3.

Figure 2:
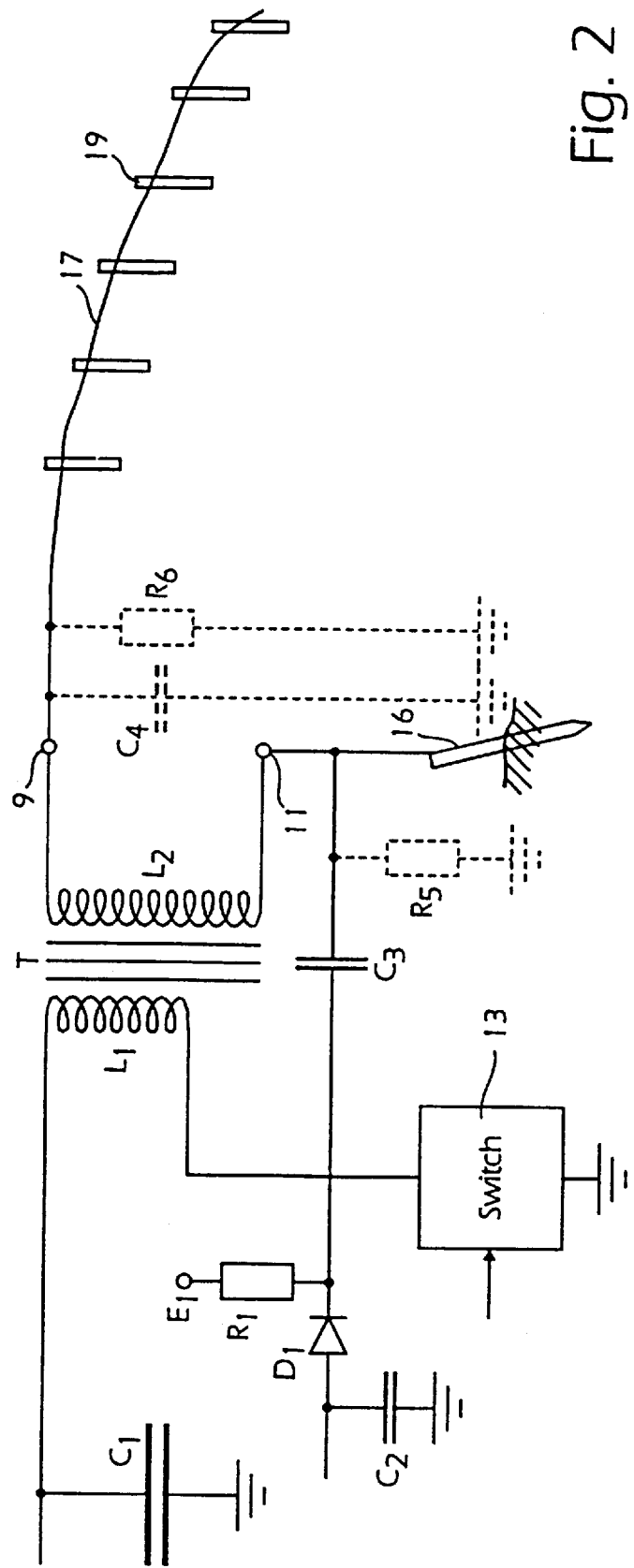
FIG. 2 shows a portion of an equivalent circuit diagram of the electric fence energizer.

In the discharge processes for the storage capacitor $C_1$ a varying potential exists in the extra winding $L_3$ owing to a capacitive coupling primarily to the secondary winding $L_2$. An equivalent circuit diagram of the right portion of the circuit diagram of FIG. 1, together with a schematically indicated fence circuit, is shown in FIG. 2.

The extra winding $L_3$ is here shown in the shape of a capacitor $C_3$, which is connected to one pole or terminal of the secondary winding $L_2$, the output terminal 11, which is also to be connected to earth. The earth connection of the fence circuit is in the conventional way made by means of an earth connection post 16 which is well inserted into the ground and is electrically represented by a resistor $R_5$, which is illustrated in dotted lines and then also is connected to the same output terminal 11 of the secondary winding $L_2$. The electric fence is shown as a conductor 17 located on posts or standards 19. An equivalent circuit for this portion is the resistor $R_6$, which is connected to the second output terminal of the secondary winding, the terminal 9, and to ground, and a capacitor $C_4$ connected in parallel to this resistor $R_6$. The capacitor $C_4$ represents the capacitance of the conductor 17 to ground which to a small extent influences the defective earth connection measurement described hereinafter.

The ground connection, which is used by the circuits on the primary side of the transformer, i.e. the ground connection for the storage capacitor $C_1$, the capacitor $C_2$, the transistor $T_1$ and the switch 13, also called signal or electronics ground, is, as been already mentioned, in a practical embodiment of the electric fence energizer a connection to one of the poles of the mains voltage (terminals 1 or 3), either a phase or the neutral or ground conductor. For the pulse times and voltages which are of interest for the measurement of defects in the earth connection as will be described below, naturally the voltage of the neutral conductor but also that of the phase voltage, for instance 230 Volts, 50 Hz, can be considered as ground potential.

When discharging the storage capacitor $C_1$ through the primary winding $L_1$ of the transformer T a voltage pulse over the primary winding is obtained, whereby a high voltage is induced over the secondary winding $L_2$ of the transformer T. First, if the connection of the fence circuit to earth is supposed to be very good, i.e. if the equivalent resistance $R_5$ is essentially equal to zero or very small compared to the resistance $R_6$ of the fence itself, also the first output connection terminal 11, connected to the earth post, is near ground potential and a very small pulse is coupled through the capacitance $C_3$. Owing to the diode $D_1$ the capacitor $C_2$ can only be charged for pulses having a negative polarity compared to the stationary voltage $V_{21,stat}$ on the first terminal of the capacitor $C_2$ (the point 21) or roughly electronics ground from the capacitance $C_3$ or the extra winding $L_3$, so that in this case the charging of the capacitor $C_3$ is negligible.

The resistors $R_3$ and $R_4$ are dimensioned so that when the whole circuit is in a static or-stationary condition and thus no high voltage is induced over the high voltage winding $L_2$, the transistor $T_1$ is saturated and its base is on a small positive voltage $V_b=V_{b,stat}$, of typically 0.6 Volt, compare also FIG. 4 described below. Also the first terminal of the capacitor $C_2$, that is the point 21 in FIG. 1, is then on the same voltage, i.e. $V_{21,stat}=V_{b,stat}$. When then, at a high voltage pulse over the secondary winding $L_2$ and bad earth connection, the voltage $V_{21}$ at the first terminal or plate of the capacitor $C_2$ in the point 21 is lower than the small positive voltage $V_{21,stat}$, also a voltage is induced having a high absolute value over the capacitance $C_3$ and then the charging of the capacitor $C_2$ starts by the fact that current flows therefrom to the equivalent capacitance $C_3$. The charging circuit of the capacitor $C_2$ is dimensioned to very rapidly achieve the charging. The discharge circuit of the same capacitor $C_2$ consisting of principally the resistors $R_2$ and $R_3$ is dimensioned to give a discharge time, which is significantly longer than the charging time and longer than the duration of the induced high voltage pulse in order to facilitate the measurement by means of the transistor circuit and the microprocessor 7. Hereby the voltage $V_{21}$ in the point 21, at charging the capacitor $C_2$, will all the time correspond the voltage which is applied through the diode $D_1$ from the extra winding $L_3$, as long as this voltage, at the start of the charging, is lower than the mentioned small positive voltage $V_{21,stat}$ and at a continued charging is lower than the earlier voltage over the capacitor $C_2$. It can also be described by the wording that the voltage over the capacitor $C_2$ locks to the most negative voltage obtained from the extra winding $L_3$.

When the voltage $V_{21}$ in the point 21 decreases from the stationary value $V_{21,stat}$, also the potential on the base of the transistor $D_1$ is reduced and a smaller current is supplied to the base. The transistor $D_1$ passes from a saturated state to an active state, what results in the fact that the potential on its collector increases. The collector potential is supplied to the input terminal PGND of the microprocessor 7 and the dimensioning of the components is made so that the potential on this input terminal passes from a logically low level to a logically high level already for a small increase of the collector voltage and thus for a still smaller reduction $V_{21,omsl}$ of the voltage in the point 21 from the stationary voltage value $V_{21,stat}$, for instance so that a transition is obtained on the input terminal, when the voltage in the point 21 decreases from the stationary value $V_{21,stat}$=0.6 Volt with $V_{21,omsl}$=0.1 Volt. In this particular case which is given as an example it is obtained that the microprocessor 7 thus senses, when the voltage $V_{21}$ in the point 21 passes the value 0.6−0.1=0.5 Volt and this is in addition valid in both directions, both for a decrease and an increase of the voltage $V_{21}$ in the point 21.

These times $t_1$, $t_2$ for passing the voltage level $V_{21,stat}$−$V_{21,omsl}$ are detected by the microprocessor 7, which for each discharge cycle of the storage capacitor $C_1$ uses the times $t_1$, $t_2$ together with the time $t_0$, when the discharge of the storage capacitor $C_1$ is started, to evaluate if a satisfactory earth connection of the fence circuit exists. In the evaluation the microprocessor 7 calculates the time differences between these times $t_0$, $t_1$ and $t_2$, for instance the differences $t_1-t_0$ and $t_2-t_0$, and compares the calculated time differences to various suitable predetermined threshold values.

When a negative pulse is obtained from the extra winding $L_3$ in a discharging of the storage capacitor $C_1$, the capacitor $C_2$ will be charged to a (negative) voltage which corresponds to the peak value, i.e. the smallest value, of the negative pulse. At the start of the negative pulse the microprocessor 7 will almost immediately sense this start and determine the time $t_1$ hereof. After the capacitor $C_2$ then has been charged maximally, it is discharged, as has been mentioned above, and the microprocessor 7 senses in the same way almost exactly the time $t_2$, when the discharge is finished and the stationary voltage value $V_{21,stat}$ (more correctly $V_{21,stat}$−$V_{21,omsl}$) again exists in the point 21.

In the diagram of FIG. 4 the voltage in the point 21 is illustrated, i.e. on the first plate or terminal of the capacitor $C_2$, as a function of the time t for cases of exterior earth connections of the fence circuit having resistances of various sizes, e.g. for the resistance $R_5$=0, which is a good, correct earth connection. The time 0 in the diagram is the time $t_0$, when the switch 13 as commanded by the microprocessor 7 is switched to a conductive state for the start of the discharge of the storage capacitor $C_1$ through the primary winding $L_1$. For such a correct earth connection essentially only a large positive high voltage pulse is obtained on the secondary side.

If the earth connection of the terminal 11 is not quite good, i.e. if the resistance $R_5$ has a significant magnitude compared to the effective resistance $R_6$ of the electric fence itself to earth, for instance is at least 10% thereof, the potential level of the voltage pulse over the secondary winding $L_2$ is displaced. If the voltage over the secondary winding thus for a good connection to earth gave a large positive voltage or voltage pulse to the fence 17 (a high potential at the terminal 9) and a very small negative voltage over the earth connection post (a small negative voltage over the resistor $R_5$, i.e. a small negative potential at the terminal 11), for a worse connection to earth only a portion of the positive voltage obtained for a good earth connection will be applied over the fence 17 (a lower potential at the terminal 9) and the negative voltage over the earth connection post 16 will be larger (a larger negative potential at the terminal 11). It means that negative pulses occur at the capacitance $C_3$ and the extra winding $L_3$. To the capacitor $C_2$ more charge is supplied due to the fact that the voltage $V_{21}$ in the point 21 significantly decreases below the stationary value $V_{2,stat}$. A larger time difference $t_2-t_0$ between the start of the discharge of the storage capacitor $C_1$ and the time $t_2$, when the voltage $V_{21}$ in the point 21 again is very close to the voltage $V_{21,stat}$, in the stationary case, will then be detected and calculated by the microprocessor 7. This time difference $t_2-t_0$ is then also a measure of the magnitude of the negative pulse or the peak value (the smallest value for the polarities used in the figures).

Typical processes of this kind are illustrated in FIG. 4 by the curves of the voltage over the capacitor $C_2$ for a resistance $R_5$ of the earth connection equal to 150 and 200 ohms.

Figure 5:
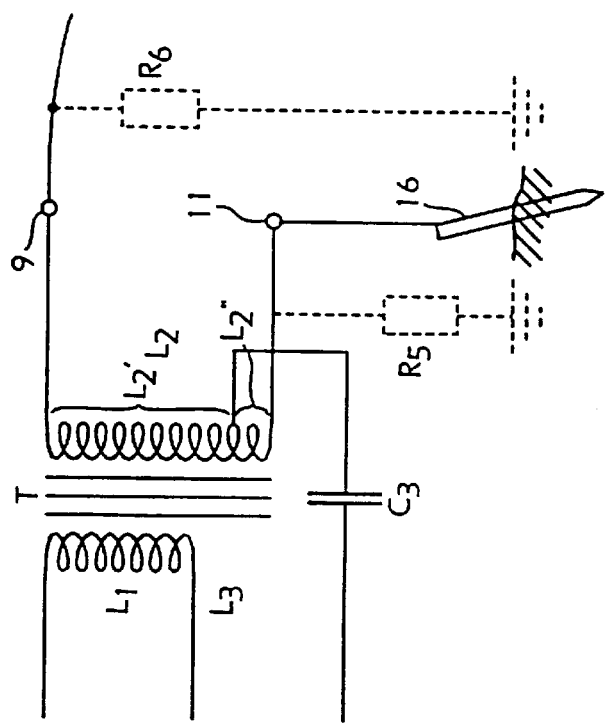
FIG. 5 shows a detail of a modified equivalent circuit diagram of the electric fence energizer.

Practically the process will, however, in certain cases, as is indicated by the curves for 0 and 50 ohms in FIG. 4, become more complicated by the fact that the capacitance $C_3$ which equivalently represents the extra winding $L_3$, in the equivalent circuit diagram will not be directly connected to the terminal 11 but at a point somewhat interior to the winding $L_2$, as is illustrated in FIG. 5, where a detail of the equivalent circuit diagram is illustrated in a more correct form. The equivalent capacitance $C_3$ is here connected at a position on the winding $L_2$, so that a first larger partial winding $L_2'$ of the secondary winding $L_2$ is arranged between the connection position for the capacitor $C_3$ and the terminal 9, where the conductor 17 of the electric fence circuit is connected, and a second, smaller partial winding $L_2''$ is arranged between the connection point and the terminal 11, to which the earth connection post 16 is connected.

The effect thereof is most noticeable in those cases when the earth connection is not too bad (the resistor $R_5$ not too large) and in these cases occurs over the capacitor $C_3$ first a positive voltage pulse, which is continued by a smaller negative voltage pulse. The start and end of this negative voltage pulse are then also detected by the microprocessor 7 but the start of the pulse, the time $t_1$, occurs later in time than in those cases when no significant positive first pulse occurs. For a good connection to earth with the resistance of the earth connection equal to zero and 50 ohms a voltage drop starts in the point 21, thus about 40 microseconds after the discharge process of the storage capacitor $C_1$ has started by activation of the switch 13. For cases of worse connections to earth with resistances 100–200 ohms the voltage drop starts directly, when the discharge of the storage capacitor $C_1$ is started.

A discrimination between these cases can be obtained from the time difference $t_1-t_0$ between the time $t_1$, when the voltage decrease in the point 21 starts, and the time $t_0$, when the discharge process of the storage capacitor $C_1$ is started by transmitting a control signal, TY, from the microprocessor 7 to the switch 13. If this time difference $t_1-t_0$ is too large, i.e. exceeds some predetermined threshold value, in the case illustrated in FIG. 3 for instance comprising about 30 microseconds, it can be decided, that the earth connection is satisfactory. These comparisons and decisions are performed by the microprocessor 7. The times $t_1$ and $t_2$ are in the diagram of FIG. 4 plotted for a good earth connection with $R_5=0$.

The magnitude of the defective earth connection signal, which is the negative "after swing" after the proper positive voltage pulse, also depends on the load which the fence is to the electric fence energizer and more particularly to the transformer T. It can mean that limit values for deciding that the earth connection is defective, which values function satisfactorily for normal loads, can appear to be too insensitive, when the electric fence is a light load, what can occur at dry weather. In order to distinguish this case, the electric fence energizer should be provided with some circuit for sensing the load of the electric fence, compare for instance our patent application filed simultaneously herewith and having the title "A mains operated electric fence energizer", this application being incorporated by reference herein. When such a circuit detects a light load, in order to eliminate it, the time limit for defective earth connections can be changed and in particular increased compared to the time limit or threshold value which is valid for a perfect earth connection. Thus, for the particular case above for a light load, when the condition $t_1-t_0<30\mu s$ is satisfied, the limit value for deciding that the earth connection is bad or faulty, can be changed from $t_2-t_0<1.5$ ms to $t_2-t_0<2.5$ ms. For an extremely heavy load, i.e. when the fence substantially constitutes a short circuit of the secondary circuit of the transformer T, defects in the connection to earth are not important and therefore, in this case, the measurement of defects in the earth connection can be disconnected.

It is obvious that the polarities in the embodiments given above as examples can be inverted, so that for instance negative voltage pulses may be used in the electric fence and then only positive voltage pulses are detected for determination of the quality of the earth connection.

Further, the arrangement of the extra-winding $L_3$ in the transformer T, which is used for coupling a portion of the high voltage of the secondary circuit for an evaluation of that high voltage, can also be used for other purposes in an electric fence energizer. Thus, by means of such a winding a voltage can be obtained, which is representative of the first large high voltage or main pulse, that is positive in the example above, on the secondary side, instead of the following, negative pulse which is used in the embodiment above. A voltage representative of the main pulse can be evaluated in a similar way with a measuring capacitor of type $C_2$ but having a diode of type $D_1$ connected with an opposite polarity and can for instance provide information of the fact whether this secondary pulse has the magnitude which has been determined by the microprocessor 7 in its control of the charging circuit 5 for the storage capacitor $C_1$.

We claim:

1. A method for determining the quality of a connection to earth by way of an earth connection post of an electric fence energizer delivering high voltage pulses to an electric fence, the energizer including a transformer having a primary winding and a secondary winding, a first exterior terminal of the secondary winding being connected to a conductor of the electric fence and a second exterior terminal thereof being connected to the earth connection, high voltage pulses being induced over the secondary winding when voltage pulses are applied to the primary winding, the method comprising the steps of:

evaluating a voltage between the second exterior terminal of the secondary winding, which is connected to the earth connection, and a ground potential, wherein
said voltage used for the evaluation is obtained capacitively from a small portion of the secondary winding.

2. A method according to claim 1, wherein a ground of electronic control circuits in the electric fence energizer is used as said ground material.

3. A method according to claim 1, wherein as the ground potential, the potential is used on either one of two conductor wires, on which the electric fence energizer is supplied with alternating current for the operation thereof.

4. A method according to claim 1, wherein in the obtained voltage the absolute difference is determined between a voltage value which exists a very small time before the time where a voltage pulse is applied to the primary winding for the induction of a high voltage pulse over the secondary winding, and a voltage value which has the largest absolute magnitude and is achieved after the voltage pulse has been applied over the primary winding.

5. A method according to claim 4, including the steps of establishing a predetermined value, comparing the value of the determined absolute difference to the predetermined value, and deciding that an unsatisfactory condition to earth exists when the determined absolute difference exceeds the predetermined value.

6. A method according to claim 1, including a step of determining a time difference between the time when the induction of a high voltage pulse starts over the secondary winding, and the time when the value of the capacitively obtained voltage after that again obtains essentially its value before the start of induction of the high voltage pulse after having deviated during the induction of the high voltage pulse from its previous value at the start of the voltage pulse by a value, the absolute magnitude of which is lower than a predetermined voltage value.

7. A method according to claim 6, wherein the determined time difference is compared to a predetermined time value, and including the step of deciding that a good connection to earth exists if the determined time difference exceeds this predetermined value.

8. A method according to claim 1, including the step of determining in the obtained voltage a time difference between the time when a voltage pulse starts to be applied to the primary winding for induction of a high voltage pulse and the time when after that the obtained voltage starts to deviate from its previous value at the start of the voltage pulse by a value, the absolute magnitude of which exceeds a predetermined voltage value.

9. A method according to claim 8 including the step of comparing the determined time difference to a predetermined value and deciding that a satisfactory connection to earth exists when the determined time difference exceeds this predetermined value.

10. A method according to claim 1, wherein the voltage pulses are applied to the primary winding so that sufficient intermediate time periods exist between the time periods during which these pulses are applied to the primary winding and during which high voltage pulses are induced over the secondary winding, in order that the electric condition in the electric fence energizer will take an essentially stationary state during said intermediate time periods.

11. A method according to claim 1, wherein in the evaluation the capacitively obtained voltage is coupled to a charging circuit for a capacitor, this coupling is connected only for a voltage over the secondary winding having an essentially predetermined polarity in relation to the voltage which is stationarily applied over the capacitor, including the steps of discharging the capacitor over a resistor, and evaluating the voltage at a charging or a discharging of this capacitor through the resistor for determining the quality of the connection to earth.

12. A method according to claim 11, wherein the capacitively obtained voltage is coupled to the charging circuit for the capacitor in such a way that the voltage controls the charging whereby the capacitor is charged to essentially an extreme value of the voltage.

13. A method according to claim 11, including the step of sensing at least one of the charged and discharged voltage by a transistor amplifier in evaluating the discharge voltage for the capacitor.

14. A method according to claim 11, wherein in the evaluation of the voltage, when charging the capacitor, the time is determined from when the voltage deviates from a previous stationary value by a value, the absolute magnitude of which is smaller than a predetermined value.

15. A method according to claim 11, wherein in the evaluation of the voltage for a discharge of the capacitor the time is determined as ending when the voltage again deviates from a previous stationary value by a value, the absolute magnitude of which is smaller than a predetermined value.

16. A device for determining the quality of a connection to earth obtained by an earth connection post of an electric fence energizer, the device comprising:

a transformer having a primary winding and a secondary winding, a first exterior terminal of the secondary winding being connected to an electrical conductor in an electric fence and a second exterior terminal of the secondary winding being connected to the earth connection post;

a generator for generation of voltage pulses over the primary winding, whereby high voltage pulses are induced over the secondary winding;

means for obtaining a voltage representing the voltage between the second exterior terminal of the secondary winding, which is connected to the earth connection post and a ground potential; and an evaluation circuit for evaluation of the obtained voltage, the means for obtaining the voltage including first and second capacitor plates in a first capacitor, the second plate of which is formed by a small portion of the secondary winding.

17. A device according to claim 16, wherein the means for obtaining the voltage use a ground potential used as a ground by electronic control circuits in the electric fence energizer.

18. A device according to claim 16, wherein the means for obtaining the voltage use as a ground potential the potential of either one of two conductive wires from which the electric fence energizer is supplied with alternating current for the operation thereof.

19. A device according to claim 16, wherein the evaluation circuit is connected to the first capacitor plate for evaluation of the voltage over the first capacitor.

20. A device according to claim 16, wherein the evaluation circuit includes means for determining in the obtained voltage the absolute difference between the voltage value which exists before pulse is applied over the primary winding for induction of a high voltage pulse, and the voltage value which has the largest absolute magnitude and is achieved after the voltage pulse has been applied over the primary winding.

21. A device according to claim 20, wherein the evaluation circuit includes comparator means for comparing the determined absolute difference with a predetermined value, and means for deciding that an unsatisfactory connection to earth exists when the determined absolute difference exceeds the predetermined value.

22. A device according to claim 16, wherein the evaluation circuit includes means for determining the time difference between the time when the induction of a high voltage pulse starts over the secondary winding, and the time after that when the value of the capacitively obtained voltage returns to the value which it had before the start of induction of the high voltage after having deviated, during the induction, from this previous value.

23. A device according to claim 22, wherein the evaluation circuit comprises comparator means for comparing the determined time difference to a predetermined time value and means for deciding that a good connection to earth exists if the determined time difference exceeds this predetermined value.

24. A device according to claim 16, wherein the evaluation circuit includes means for determining, with regard to the obtained voltage, the time difference between the time when a voltage pulse starts to be applied over the primary winding for induction of a high voltage pulse, and the time thereafter when the obtained voltage deviates from its previous value at the start of the voltage pulse by a value which exceeds a predetermined voltage value.

25. A device according to claim 24, wherein the evaluation circuit includes comparator means for comparing the determined time difference to a predetermined value, and means for deciding that a satisfactory connection to earth exists when the determined time difference exceeds this predetermined value.

26. A device according to claim 16 wherein the evaluation circuit includes
- a second capacitor with a charging circuit therefor,
- a rectifier for coupling the voltage on the first capacitor plate in the first capacitor to the charging circuit for the second capacitor,
- a resistor connected to the second capacitor through which the second capacitor can be discharged, and
- an evaluation device for determining at least one of the charge voltage and discharge voltage of the second capacitor.

27. A device according to claim 26, wherein the second capacitor has its first terminal connected to the ground potential and has its second terminal connected to the rectifier.

28. A device according to claim 26, wherein said resistor connected to the second capacitor including one terminal and another terminal and the evaluation device includes a connection line for applying the voltage over the second capacitor to one terminal of said resistor, another terminal of the resistor being connected to a direct voltage and through which the voltage over the second capacitor can be discharged.

29. A device according to claim 28, wherein the resistor comprises a voltage divider, the central connection of which is connected to the base of a transistor.

30. A device according to claim 16, wherein the first capacitor plate in the first capacitor includes an extra winding in the transformer located at or adjacent the secondary winding.

31. A device according to claim 30, wherein the extra winding in the transformer comprises a layer of winding wire located adjacent to at least one layer of winding wire which are comprised in the secondary winding.

32. A method for coupling a voltage in an electric fence energizer, the electric fence energizer including a transformer having a primary winding and a secondary winding, the secondary winding having one exterior terminal and an other exterior terminal, the one exterior terminal of the secondary winding being connected to a conductor in an electric fence, the other exterior terminal of the secondary winding being connected to an exterior earth connection, a generator for generating voltage pulses over the primary winding of the transformer, and a control circuit, the voltage being coupled to a control circuit and being representative of the voltage over the secondary winding, the method comprising the steps of
- generating voltage pulses over the primary winding using the generator to induce high voltage pulses over the secondary winding, and
- capacitively coupling the voltage over a small part of the secondary winding to the control circuit.

33. A method according to claim 32, wherein said capacitive coupling step includes obtaining a voltage at one end of an extra winding in the transformer, said extra winding being located adjacent the secondary winding.

34. An electric fence energizer comprising:
- a transformer having a primary winding and a secondary winding, one exterior terminal of the secondary winding being connectable to an electrical conductor in an electric fence and another exterior terminal of the secondary winding being connectable to an exterior earth connection device;
- a generator for generating voltage pulses over the primary winding for inducing high voltage pulses over the secondary winding; and
- a capacitor having a first capacitor plate and a second capacitor plate formed by a small part of the secondary winding.

35. A device according to claim 34, wherein the first capacitor plate in the capacitor comprises an extra winding in the transformer located adjacent the secondary winding.

36. A device according to claim 35, wherein the extra winding in the transformer comprises one layer of winding wire located adjacent to at least one layer of winding wire which are included in the secondary winding.

37. A method of determining the quality of a connection to earth by way of an earth connection post of an electric fence energizer, the energizer including a transformer having a primary winding and a secondary winding, the secondary winding including a first exterior terminal for connection to the conductor of an electric fence and a second exterior terminal connected to the earth connection post, the energizer further including means for applying voltage pulses to the primary winding and thereby inducing high voltage pulses over the secondary winding, said method comprising the steps of:
- storing a charge in a capacitor with voltage obtained from a portion of the secondary winding, said voltage being representative of the voltage between the second exterior terminal and ground potential; and
- evaluating the voltage across the capacitor for characteristics indicative of the quality of the connection to earth of the second exterior terminal.

38. The method as set forth in claim 37, the voltage being obtained through a charging circuit, said portion of the secondary winding having an essentially predetermined polarity, said storing step including the step of performing at least one of charging and discharging the capacitor through a resistor, said evaluating step including the step of evaluating the voltage across the capacitor during at least one of said charging and discharging.

* * * * *